(12) United States Patent
Ammerl et al.

(10) Patent No.: US 11,443,974 B2
(45) Date of Patent: Sep. 13, 2022

(54) DEVICE AND METHOD FOR REMOVING A FRAMED WAFER FROM A WAFER TRAY

(71) Applicant: MUETEC AUTOMATISIERTE MIKROSKOPIE UND MESSTECHNIK GMBH, Munich (DE)

(72) Inventors: Josef Ammerl, Obernzell (DE); Michael Froeschl, Buchhofen Ottmaring (DE)

(73) Assignee: MueTec Automatisierte Mikroskopie und Meßtechnik GmbH, Munich (DE)

( * ) Notice: Subject to any disclaimer, the term of this patent is extended or adjusted under 35 U.S.C. 154(b) by 0 days.

(21) Appl. No.: 17/221,128

(22) Filed: Apr. 2, 2021

(65) Prior Publication Data
US 2021/0320028 A1   Oct. 14, 2021

(30) Foreign Application Priority Data
Apr. 8, 2020 (DE) ..................... 10 2020 109 866.9

(51) Int. Cl.
*H01L 21/687* (2006.01)
*H01L 21/677* (2006.01)
(Continued)

(52) U.S. Cl.
CPC ........ *H01L 21/68707* (2013.01); *B25J 9/042* (2013.01); *B25J 17/0208* (2013.01)

(58) Field of Classification Search
CPC ......... H01L 21/67383; H01L 21/68721; H01L 21/67742; H01L 21/68; H01L 21/68707; H01L 21/67766; B25J 9/042; B25J 9/043
See application file for complete search history.

(56) References Cited

U.S. PATENT DOCUMENTS 5,632,477 A * 5/1997 Morinaga ............... B65H 1/08
  271/171
6,513,848 B1 * 2/2003 Shendon ........... H01L 21/68707
  294/196
(Continued)

FOREIGN PATENT DOCUMENTS

CN    102 709 222 A    10/2012
CN    102 751 228 A    10/2012
(Continued)

OTHER PUBLICATIONS

TIPO Search Report and translation, in TW application No. 110111202, filed Mar. 26, 2021, completed Jun. 24, 2021 (2 pages).
(Continued)

*Primary Examiner* — Gerald McClain
(74) *Attorney, Agent, or Firm* — McAndrews, Held & Malloy, Ltd.; Michael S. Tomsa

(57) ABSTRACT

A device for removing a framed wafer from a wafer tray is described. The wafer tray including a wafer receptacle for receiving the framed wafer. The wafer receptacle being configured to hold the wafer perpendicular to the wafer plane and to remove it from the wafer tray in this manner. The wafer receptacle including at least one wafer receptacle edge contact element arranged and configured to abut against the front frame edge. The device including a drive and control device configured to guide the wafer receptacle along a predetermined path of movement into the access to the wafer tray. Each wafer receptacle edge contact element is spring-mounted in the direction of the path of movement and the wafer receptacle is movable from a first position to a second position.

15 Claims, 5 Drawing Sheets

(51) Int. Cl.
*B25J 9/04* (2006.01)
*B25J 17/02* (2006.01)

(56) References Cited

U.S. PATENT DOCUMENTS

| | | | |
|---|---|---|---|
| 2006/0192400 A1* | 8/2006 | Kim | H01L 21/68707 |
| | | | 294/103.1 |
| 2008/0224491 A1 | 9/2008 | Gillespie et al. | |
| 2008/0304942 A1 | 12/2008 | Yazawa et al. | |
| 2011/0187140 A1 | 8/2011 | Hashimoto et al. | |
| 2013/0180953 A1* | 7/2013 | Iwai | H01L 21/681 |
| | | | 118/712 |

FOREIGN PATENT DOCUMENTS

| | | | |
|---|---|---|---|
| CN | 102738056 A | 10/2012 | |
| DE | 10 2020 109 866 B3 | 7/2021 | |
| EP | 1 041 604 A2 | 10/2000 | |
| JP | 2011124591 A * | 6/2011 | G03F 1/62 |
| JP | 2017-076679 A | 4/2017 | |
| WO | 2013/000428 A1 | 1/2013 | |

OTHER PUBLICATIONS

The extended European search report for Application No. 21164346.5, dated Aug. 5, 2021, European Patent Office, Germany (8 pages).

* cited by examiner

DEVICE AND METHOD FOR REMOVING A FRAMED WAFER FROM A WAFER TRAY

The present disclosure relates to a device and a method for removing a framed wafer from a wafer tray.

Such a device is part of a transport mechanism, in particular a robot, used to transport framed wafers from a wafer tray to an inspection device. The framed wafers are taken by means of a wafer receptacle of the transport mechanism from the wafer tray and placed in the inspection device. In order to ensure a complete and correct inspection of the framed wafers, they must be at a defined target position in the inspection device. It is therefore desirable that the wafer receptacle of the transport mechanism places the framed wafers in the target position thereof in the inspection device. It has been found, however, that, even if the framed wafers were already placed in the wafer tray in the correct position for their later target position in the inspection device, they no longer occupied this target position in the inspection device after their transport.

Therefore, the object of the present disclosure is to improve the transport of framed wafers from the wafer tray to the inspection device in such a way that the framed wafers are placed in the target position thereof in the inspection device.

According to the present disclosure, the foregoing can be achieved by a device according to claim 1 and a method according to claim 8.

The present disclosure is based on the finding that a change in position of the framed wafer can already occur when a framed wafer is removed from the wafer tray, so that the actual position thereof no longer coincides with the target position thereof, that is, the actual orientation thereof with respect to the wafer receptacle no longer matches with the target orientation thereof. The reason for this was found to be that the framed wafer, when it is removed, may be pressed against the rear wall of the wafer tray by the wafer receptacle and then clamped between the wafer receptacle and the rear wall and may thus be slightly elastically deformed. If the wafer receptacle then moves back with the framed wafer in order to move out of the wafer tray, the framed wafer suddenly relaxes and therefore leaps on the wafer receptacle and thus changes position or orientation on the wafer receptacle.

The measures according to the present disclosure make it possible to limit a clamping of a framed wafer between the wafer receptacle and the wafer tray, thus limiting elastic deformation of the framed wafer to a predetermined amount and avoiding sudden relaxation of the elastic deformation. A leap of the framed wafer on the wafer receptacle and thus an unwanted change in position on the wafer receptacle are prevented in this way.

Because the elements of the wafer receptacle coming into contact with the front edge of the framed wafer are spring-mounted in the direction of movement of the wafer receptacle, the force with which the rear edge of the framed wafer to be removed is pressed against the wafer tray edge contact element can be limited to the magnitude of the spring force.

On the other hand, when the wafer receptacle is retracted, the compression of the spring mounting is initially relaxed, i.e., the amount of compression of the spring mounting decreases in accordance with the distance travelled when the wafer receptacle is retracted. Thus, the removed framed wafer is not unloaded suddenly, but gradually in accordance with the gradual decrease in spring force associated with the gradually decreasing compression of the spring mounting. The rate of decrease, i.e., the time until the framed wafer is no longer clamped between the wafer receptacle edge contact element and the wafer tray edge contact element, and the framed wafer is thus placed on the wafer receptacle in a tensionless manner, is determined by the speed at which the wafer receptacle retracts out of the wafer tray.

When the front frame edge has at least two frame edge contact elements and all frame edge contact elements are positioned on one line, the device according to the present disclosure also has at least two wafer receptacle edge contact elements and all wafer receptacle edge contact elements are positioned on one line, said line extending at a predetermined angle with respect to the path of movement and all wafer receptacle edge contact elements being arranged and configured to abut against frame edge contact elements. With these measures, it is possible to intentionally change the position or the orientation of the framed wafer on the wafer receptacle when it is taken from the wafer tray, since the wafer receptacle edge contact elements positioned on one line align the framed wafer with this line when they abut with the frame edge contact elements.

When the wafer receptacle has only a single wafer receptacle edge contact element, it is also conceivable that the wafer tray has at least two wafer tray edge contact elements and all wafer tray contact elements are positioned on one line, said line extending at a predetermined angle with respect to the path of movement. In this case, the rear frame edge of the framed wafer would have at least two second frame edge contact elements, all second frame edge contact elements being positioned on one line and all wafer tray edge contact elements being arranged and configured to abut against second frame edge contact elements. As a result, the position or orientation of the framed wafer on the wafer receptacle is aligned with this line when taken from the wafer tray.

Here, all of the wafer-receptacle edge contact elements are preferably arranged on one line extending perpendicularly to the path of movement. This significantly simplifies the structural design of a device according to the present disclosure.

Particularly preferably, all of the wafer receptacle edge contact elements are arranged on one line extending horizontally. This measure allows a further considerable simplification of the structural design.

In a favorable development of the invention, at least one spring mounting includes a flexurally and/or torsionally elastic rod which is clamped in a flexurally and torsionally rigid manner at one end while otherwise cantilevering freely and at the other free end of which a wafer receptacle edge contact element is attached, the modulus of elasticity, the cross section and the free cantilever length of the rod being attuned to one another so that the wafer receptacle edge contact element is mounted on the rod with a predetermined spring constant in the direction of the path of movement. In this way, a spring mounting that is both extremely simple and robust is achieved. Since only a few individual parts are included, the assembly effort thereof is low and the reliability in operation over the long term is ensured.

The rod advantageously extends in parallel to the plane of a framed wafer to be received. The installation space required by a device according to the present disclosure is thereby reduced.

The spring mounting preferably has a spring constant in the range from 0.5 N/mm to 5.0 N/mm, particularly preferably in the range from 0.8 N/mm to 3.0 N/mm, and very particularly preferably in the range from 1.2 N/mm to 2.0 N/mm. With spring constants in these ranges of magnitude, the spring mounting exerts a compressive force on the framed wafer that, on the one hand, is sufficiently large to safely take it from the wafer tray and possibly align it, but, on the other hand, is not so large that the framed wafer is elastically deformed to a significant extent.

DRAWINGS

The present disclosure is explained in more detail below with reference to the drawings. In the figures.

DESCRIPTION

Figure 1:
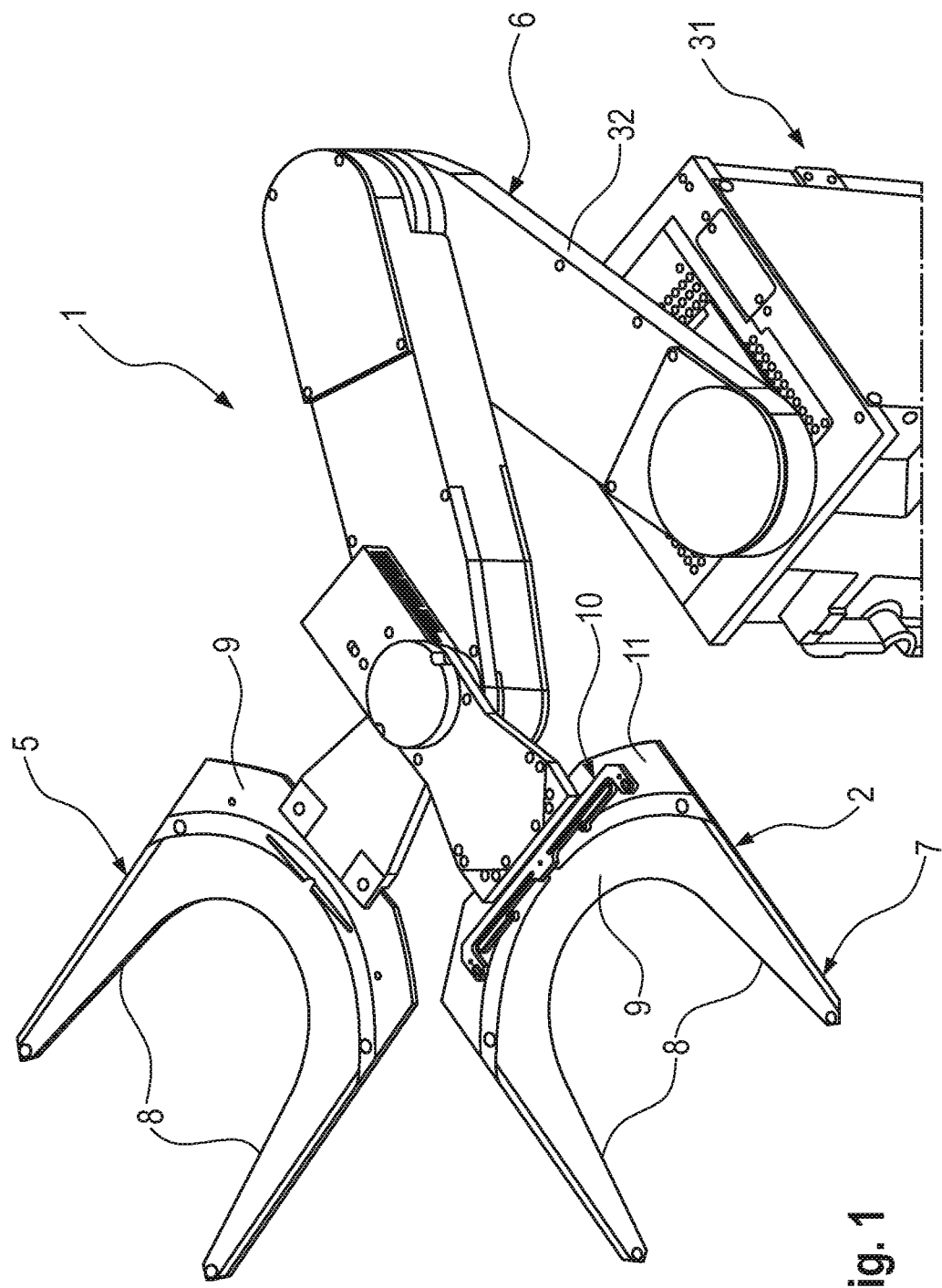
FIG. 1 shows a perspective view of an embodiment of a device according to the an example.
Figure 2:
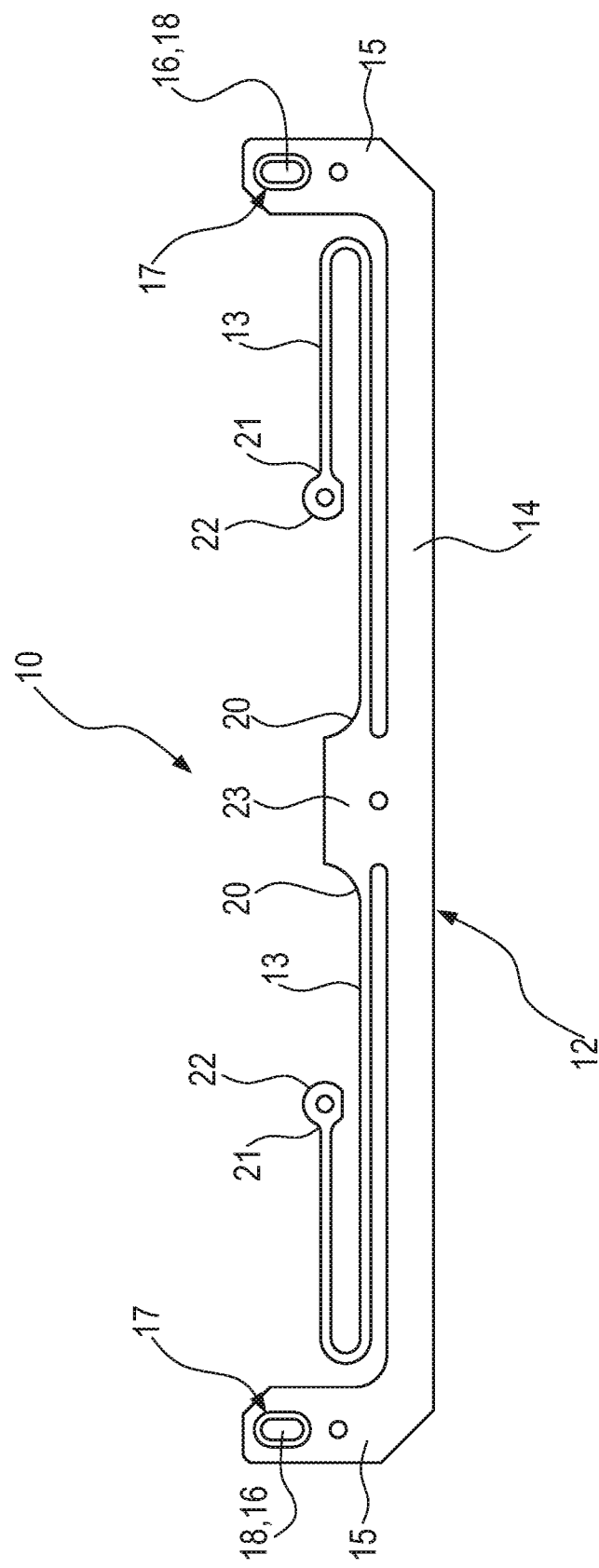
FIG. 2 shows a top view of the "spring mounting" component.
Figure 3:
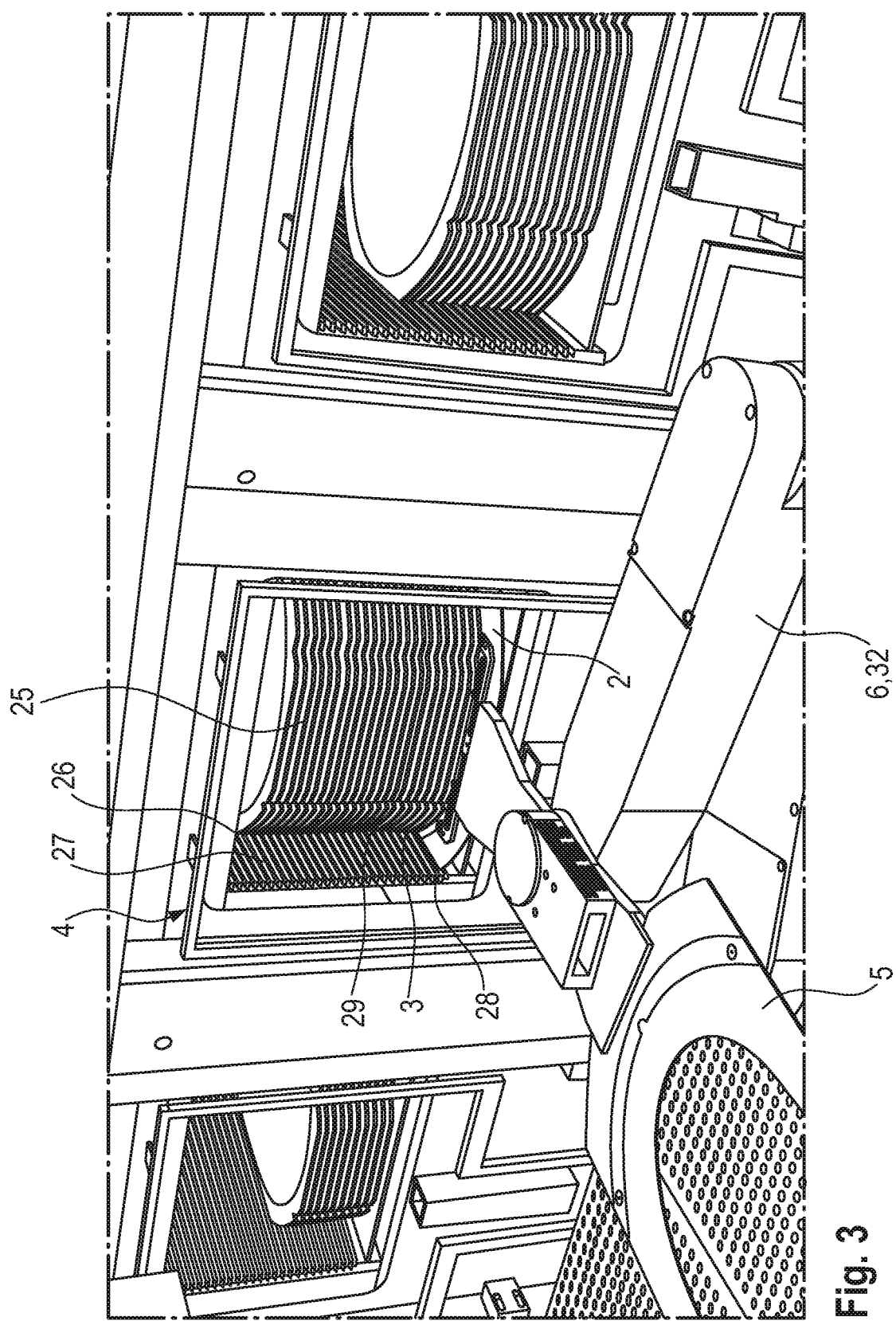
FIG. 3 shows, in a perspective view, the embodiment from FIG. 1 when a framed wafer is removed from a wafer tray.

The embodiment of a device 1 according to the present disclosure shown in the figures includes a first wafer receptacle 2 for removing a framed wafer 3 from a wafer tray 4 and transferring it to an inspection device (not shown) and additionally a second wafer receptacle 5 for removing the framed inspected wafer from the Inspection device and for transferring it to a wafer tray 4, and a drive and control device 6 for respectively driving the two wafer receptacles 2, 5 and respectively controlling the movement thereof.

The two wafer receptacles 2, 5 are each configured in the form of a fork 7 with two fork prongs 8 or in a U-shape. The fork 7 is oriented horizontally, i.e. the framed wafer 3 rests horizontally on the respective wafer receptacle 2, 5 and is held perpendicular to the wafer plane and in this way removed from the wafer tray 4. At their base 9 connecting the two fork prongs 8 or the two U-legs, the two wafer receptacles 2, 5 are each attached to the drive and control device 6 with which each wafer receptacle 2, 5 is moved along a predetermined path of movement.

The first wafer receptacle 2 has a spring mounting 10. The spring mounting 10 is attached to the upper side 11 of the first wafer receptacle 2 on the base 9 thereof. The spring mounting 10 includes a rigid fastening portion 12 resistant to deformation and two spring elements 13. By means of the fastening portion 12, on the one hand, the spring mounting 10 is fastened on the upper side 11 of the first wafer receptacle 2. On the other hand, the two spring elements 13 are fastened to the fastening portion 12, i.e., the fastening portion 12 serves as an abutment on which the spring elements 13 are supported and against which they are elastically deformed.

The fastening portion 12 has an elongated base portion 14 extending transversely to the fork prongs 8 in the direction of the base 9 of the first wafer receptacle 2. At each end of the base portion 14, a short leg 15 is formed which extends in the direction of the fork prongs 8 and includes fastening elements 16 for fastening the fastening portion 12 on the wafer receptacle 2.

Moreover, the fastening portion 12 includes an adjusting device 17 for adjusting the position and orientation of the spring mounting 10 on the wafer receptacle 2. This makes it possible, for example, for a predetermined path of movement of the wafer receptacle 2, in particular for a predetermined end point of the path of movement in the wafer tray 4, to easily adjust the desired magnitude of the compression of the spring mounting 10 to the actual local conditions by positioning the spring mounting 10 for-wards or backwards on the wafer receptacle 2 in the direction of the forks 8. In addition, the desired angular orientation of the framed wafer 3 when removing it from the wafer tray 4 can be preset by fastening the spring mounting 10 to the wafer receptacle 2 at a corresponding angle with respect to the path of movement of the wafer receptacle 2.

In the illustrated embodiment, said adjusting device 17 is configured as an elongated hole 18 in each of the two short legs 15 of the fastening portion 12, each elongated hole 18 being penetrated by a fastening screw 19 with which the spring mounting 10 is fastened to the first wafer receptacle 2.

The spring elements 13 of the spring mounting 10 are each configured in the form of a freely cantilevered rod which is connected to the fastening portion 12 in a flexurally rigid and torsionally rigid manner at a first end 20 and includes a wafer receptacle edge contact element 22 at a second, free end 21 thereof. The spring elements are thus each configured as a spring rod 13.

The fastening portion 12 has a projection 23 in the middle of the base portion 14 in the direction of the fork prongs 8, the first ends 20 of the spring rods 13 being connected to the projection 23, which thus serves as an abutment for the spring elements 13. From this projection 23, the spring rods 13 extend along the fastening portion 12 up to a 180° bend at a predetermined distance in front of the respective short leg 15 of the fastening portion 12 and then extend again along the fastening portion 12 towards the projection 23.

The wafer receptacle edge contact elements 22 are configured in the form of a circular ring with a predetermined outer diameter and with a predetermined thickness perpendicular to the circular plane, the circular plane being parallel to the plane of the wafer 3 to be removed, that is, extending horizontally in the present case. The outer circumferential surface 24 of the circular ring is used for abutment against the front frame edge 25 of the framed wafer 3 to be removed.

When abutting against the front frame edge 25 of the wafer 3 to be re-moved, a compressive force is introduced into the spring rod 13 transversely to the longitudinal axis thereof and causes an elastic bending deformation thereof. The spring constant of the spring rod 13 is substantially determined by modulus of elasticity, cross section and free cantilever length thereof.

The removal of a framed wafer 3 from a wafer tray 4 by means of the de-vice 1 according to the present disclosure is described below:

Here, the wafer tray 4 includes an access 26 for removing a framed wafer 3 and a framed wafer 3 to be removed stored in the wafer tray 4 has a front frame edge 25 facing the access 26. The wafer tray 4 also includes at least one (not shown) wafer tray edge contact element arranged and configured to abut against the rear frame edge (also not shown) of the wafer 3 to be removed.

In the illustrated embodiment, the wafer tray 4 has two opposite vertical side walls 27 extending from the front end of the wafer tray 4 forming the access 26 to the rear end including the wafer tray edge contact element. The side walls 27 each have a plurality of grooves 28 which are arranged one above the other and opposite one another in pairs and extend horizontally from the front to the rear end, the framed wafers 3 being placed therein with their side edges 29. The vertical spacing between the grooves 28 is chosen such that the spacing between the framed wafers 3 placed therein is such that a wafer receptacle 2 can move in between the placed wafers 3.

The horizontal width of the wafer receptacle 2 is configured such that the wafer receptacle 2 can be inserted between ridges 30 which separate adjacent grooves 28 from one another.

In the illustrated embodiment, the device 1 for removing a framed wafer 3 from the wafer tray 4 is a robot 31 with a robot arm 32, by means of which the first and second wafer receptacles 2, 5 are guided along respective predetermined paths of movement.

In order to remove a framed wafer 3 from the wafer tray 4, the first wafer receptacle 2 is positioned in front of the access 26 of the wafer tray 4. The first wafer receptacle 2 is positioned slightly below the wafer 3 to be removed so that it can be guided into the free space between the wafer 3 to be removed and a wafer that may possibly be placed underneath.

Now, the first wafer receptacle 2 is pushed forward into the wafer tray 4 until the first wafer receptacle 2 is positioned under the framed wafer 3 to be removed and then it is raised until the wafer 3 to be removed is at least also resting on the wafer receptacle 2.

Figure 4:
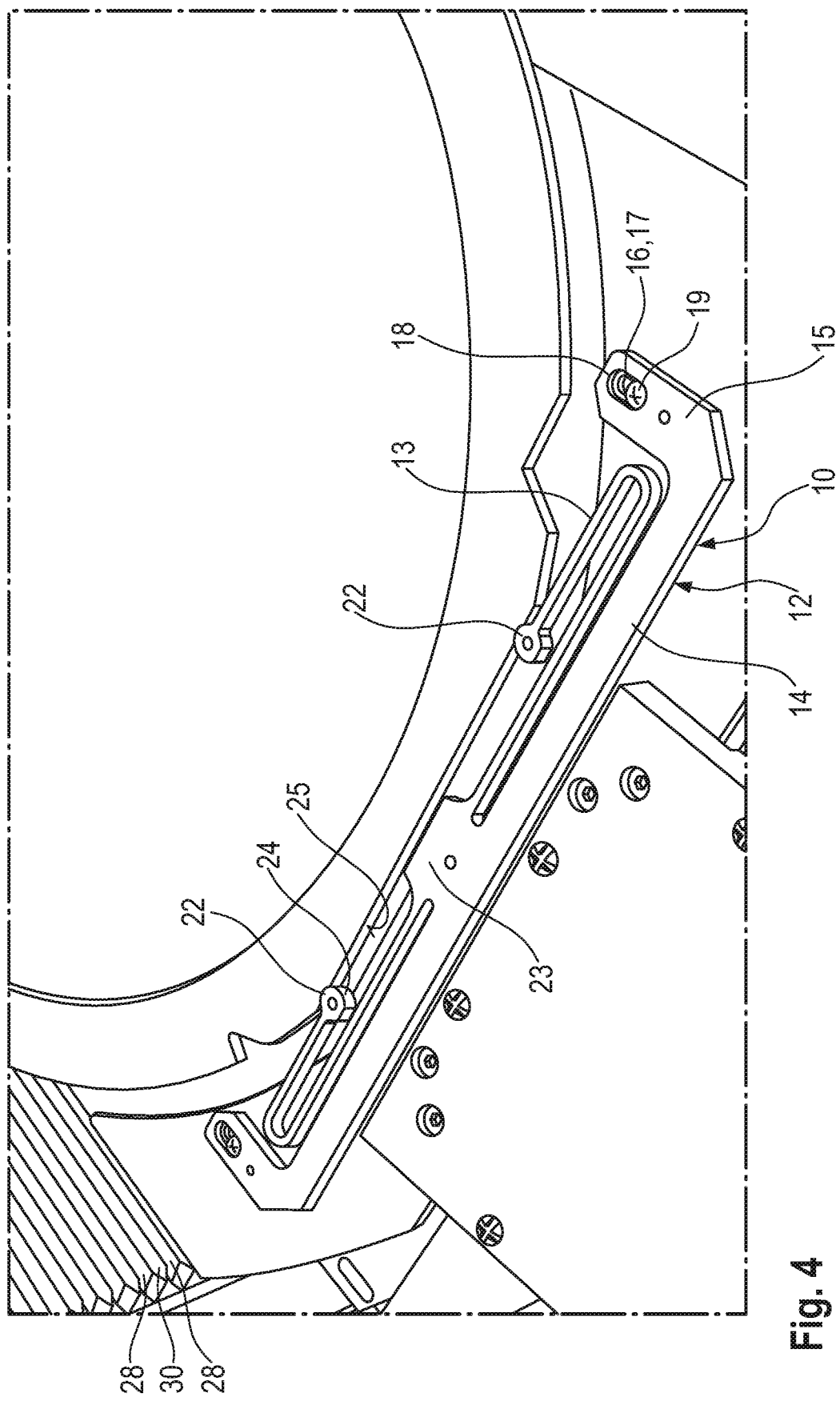
FIG. 4 shows a detailed view from FIG. 3, with the spring mounting resting against the front frame edge of the framed wafer without pressure and thus not being compressed yet.
Figure 5:
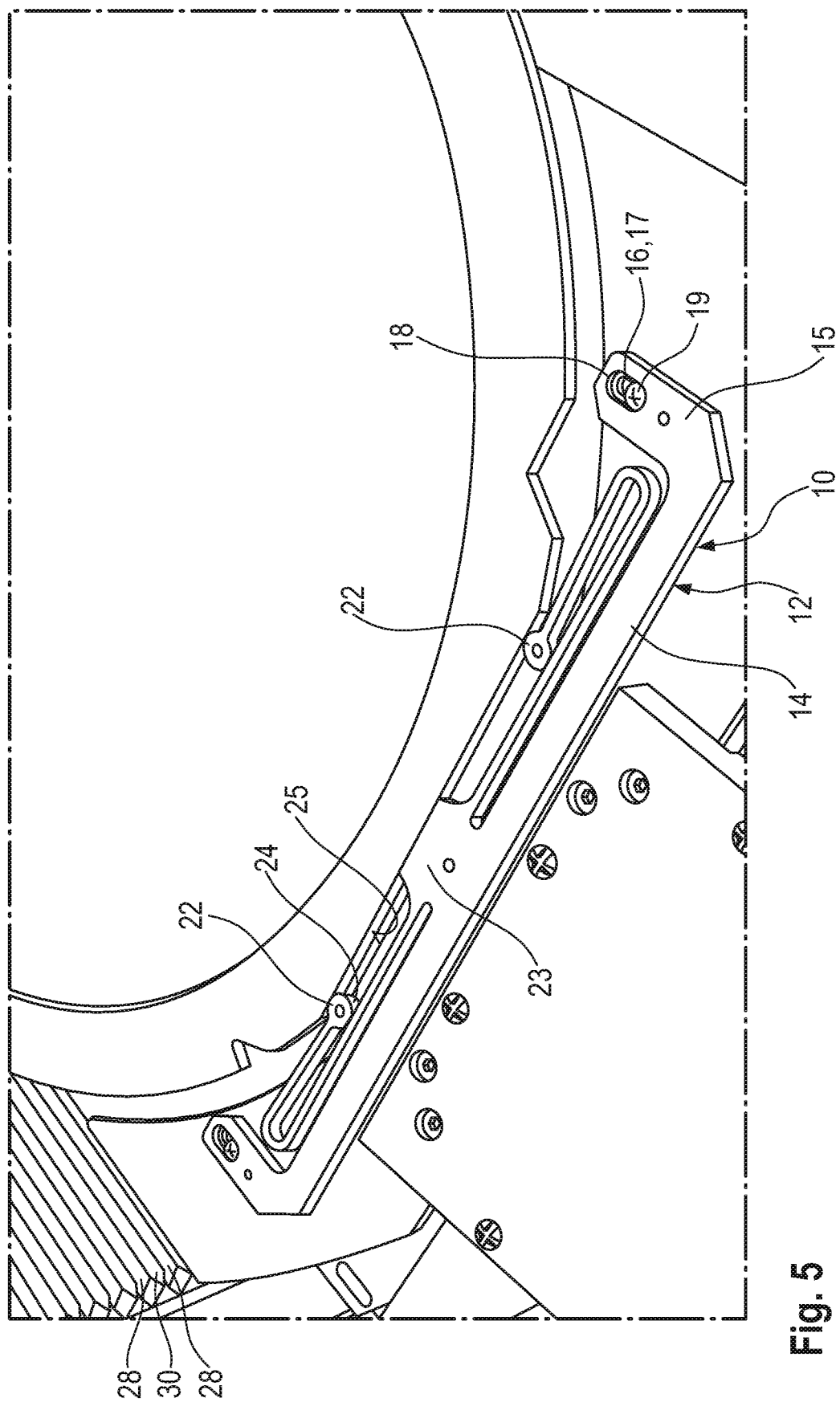
FIG. 5 shows a detailed view similar to FIG. 4, with the spring mounting resting against the front frame edge of the framed wafer with pressure and now being compressed.

Now, the first wafer receptacle 2 is pushed further horizontally into the wafer tray 4 until all the wafer receptacle edge contact elements 22 abut against the front frame edge 25 of the framed wafer 3 without compressing the spring mounting 10 or spring elements 13 (FIG. 4), and then it is pushed further forward until the rear frame edge of the framed wafer 3 abuts against the at least one wafer tray edge contact element and the spring mounting 10 or spring elements 13 is/are compressed by a predetermined amount, that is, in the illustrated embodiment, the spring rods 13 are elastically deformed by a predetermined amount.

The first wafer receptacle 2 is now guided out of the wafer tray 4, i.e., moved backwards. Here, the first wafer receptacle 2 can still be raised a little, that is its path of movement can lead slightly upwards so that—if the framed wafer 3 has also rested in the grooves 28 of the wafer tray 4—it now only rests on the first wafer receptacle 2 and no longer in the grooves 28 of the wafer tray 4.

By moving back the wafer receptacle 2, the spring mounting 10 of the wafer receptacle edge contact elements 22 is unloaded again. The unloading speed is controlled by means of the speed at which the wafer receptacle 2 is moved back. This means that the compressive force with which the framed wafer 3 to be removed is clamped between the wafer receptacle edge contact elements 22 and the at least one wafer tray edge contact element decreases in accordance with the unloading speed and thus its decrease can be controlled and a sudden decrease can be avoided. This prevents the wafer 3 to be removed from leaping on the wafer receptacle 2.

After the spring mounting 10 has been completely unloaded, the framed wafer 3 can then be guided out of the wafer tray 4 at maximum speed.

The invention claimed is:

1. A device for removing a framed wafer from a wafer tray, the wafer tray including an access for depositing or removing the framed wafer, wherein the deposited framed wafer includes a front frame edge facing said access and said wafer tray includes at least one wafer tray edge contact element for abutment against a rear frame edge, the device comprising:
a wafer receptacle for receiving the framed wafer, wherein said wafer receptacle is configured to hold the framed wafer perpendicular to a wafer plane and to remove the framed wafer from said wafer tray in this manner;
including at least one wafer receptacle edge contact element arranged and configured to abut against said front frame edge; and
a drive and control device configured to guide said wafer receptacle along a predetermined path of movement into said access of said wafer tray and out of said access,
wherein each wafer receptacle edge contact element is spring-mounted via a spring mounting in a direction of said predetermined path of movement and said wafer receptacle is movable from a first position, in which each wafer receptacle edge contact element is at a distance in front of said front frame edge, into a second position, in which each wafer receptacle edge contact element abuts against said front frame edge, the rear frame edge abuts against the wafer tray edge contact element and said spring mounting of each wafer receptacle edge contact element is compressed by a pre-determined spring travel, and back wherein at least one spring mounting includes a flexurally or torsionally elastic spring rod that is clamped in a flexurally and torsionally rigid manner at one end while otherwise cantilevering freely and on the other, free end of which a wafer receptacle edge contact element is fastened, wherein a modulus of elasticity, a cross section and a free cantilever length of said spring rod are attuned to one another such that the wafer receptacle edge contact element is mounted on said spring rod with a predetermined spring constant in the direction of said predetermined path of movement.

2. The device according to claim 1, wherein all frame edge contact elements are arranged on a first line, wherein said wafer receptacle includes at least two wafer receptacle edge contact elements and all wafer receptacle edge contact elements are arranged on a second line, said second line extending a predetermined angle with respect to said predetermined path of movement and all wafer receptacle edge contact elements being arranged and configured to abut against frame edge contact elements.

3. The device according to claim 2, wherein all of the wafer receptacle edge contact elements are arranged on the second line extending perpendicularly to said predetermined path of movement.

4. The device according to claim 2, wherein all of the wafer receptacle edge contact elements are arranged on the second line extending horizontally.

5. The device according to claim 1, wherein said spring rod extends in parallel to the plane of a framed wafer to be received.

6. The device according to claim 1, wherein said spring mounting has a spring constant in the range from 0.5 N/mm to 5.0 N/mm.

7. A method for removing a framed wafer from a wafer tray including an access for depositing or removing the framed wafer, wherein the deposited framed wafer includes a front frame edge facing the access and the wafer tray includes at least one wafer tray edge contact element for abutment against the rear frame edge, comprising the steps of:
providing a device according to claim 1;
positioning said wafer receptacle in front of said access of said wafer tray of the framed wafer to be removed;

moving said wafer receptacle along said predetermined path of movement until all the wafer receptacle edge contact elements abut against said front frame edge without compressing the spring mounting;

moving said wafer receptacle further along said predetermined path of movement until the rear frame edge abuts against the at least one wafer tray edge contact element and said spring mounting of each wafer receptacle edge contact element is compressed by a predetermined amount;

holding the framed wafer perpendicular to the wafer plane by means of said wafer receptacle;

moving back said wafer receptacle along said predetermined path of movement until said spring mounting of each wafer receptacle edge contact element is unloaded again; and guiding the framed wafer out of said wafer tray by means of said wafer receptacle.

8. A device for removing a framed wafer from a wafer tray, the wafer tray including an access for depositing or removing the framed wafer, wherein the deposited framed wafer includes a front frame edge facing said access and said wafer tray includes at least one wafer tray edge contact element for abutment against a rear frame edge, the device comprising:

a wafer receptacle for receiving the framed wafer, wherein said wafer receptacle is configured to hold the framed wafer perpendicular to a wafer plane and to remove the framed wafer from said wafer tray in this manner;

at least one wafer receptacle edge contact element arranged and configured to abut against said front frame edge; and a drive and control device configured to guide said wafer receptacle along a predetermined path of movement into and out of said access of said wafer tray, wherein each wafer receptacle edge contact element is spring-mounted via a spring mounting in a direction of said predetermined path of movement and said wafer receptacle is movable from a first position, in which each wafer receptacle edge contact element is at a distance in front of said front frame edge, into a second position, in which each wafer receptacle edge contact element abuts against said front frame edge, the rear frame edge abuts against the wafer tray edge contact element and said spring-mounted wafer receptacle edge contact element is compressed by a pre-determined spring travel, and back, and wherein the at least one spring mounting includes a flexurally or torsionally elastic spring rod having a first end and a second end, wherein the first end is clamped in a flexurally and torsionally rigid manner while otherwise cantilevering freely and the second end includes the at least one wafer receptacle edge contact element fastened thereon.

9. The device according to claim 8, wherein a modulus of elasticity, a cross section and a free cantilever length of said spring rod are attuned to one another such that the wafer receptacle edge contact element is mounted on said spring rod with a predetermined spring constant in the direction of said predetermined path of movement.

10. The device according to claim 8, wherein said front frame edge includes at least two frame edge contact elements and all frame edge contact elements are arranged on a first line, wherein said wafer receptacle includes at least two wafer receptacle edge contact elements and all wafer receptacle edge contact elements are arranged on a second line, said second line extending a predetermined angle with respect to said predetermined path of movement and all wafer receptacle edge contact elements being arranged and configured to abut against frame edge contact elements.

11. The device according to claim 10, wherein all of the wafer receptacle edge contact elements are arranged on the second line extending perpendicularly to said predetermined path of movement.

12. The device according to claim 10, wherein all of the wafer receptacle edge contact elements are arranged on the second line extending horizontally.

13. The device according to claim 8, wherein said spring rod extends in parallel to the plane of a framed wafer to be received.

14. The device according to claim 8, wherein said spring mounting has a spring constant in the range from 0.5 N/mm to 5.0 N/mm.

15. A method for removing a framed wafer from a wafer tray including an access for depositing or removing the framed wafer, wherein the deposited framed wafer includes a front frame edge facing the access and the wafer tray includes at least one wafer tray edge contact element for abutment against the rear frame edge, comprising the steps of:

providing a device according to claim 8;

positioning said wafer receptacle in front of said access of said wafer tray of the framed wafer to be removed;

moving said wafer receptacle along said predetermined path of movement until all the wafer receptacle edge contact elements abut against said front frame edge without compressing the spring mounting;

moving said wafer receptacle further along said predetermined path of movement until the rear frame edge abuts against the at least one wafer tray edge contact element and said spring mounting of each wafer receptacle edge contact element is compressed by a predetermined amount;

holding the framed wafer perpendicular to the wafer plane by means of said wafer receptacle;

moving back said wafer receptacle along said predetermined path of movement until said spring mounting of each wafer receptacle edge contact element is unloaded again; and guiding the framed wafer out of said wafer tray by means of said wafer receptacle.

* * * * *